(12) United States Patent
Williams

(10) Patent No.: US 6,463,001 B1
(45) Date of Patent: Oct. 8, 2002

(54) CIRCUIT AND METHOD FOR MERGING REFRESH AND ACCESS OPERATIONS FOR A MEMORY DEVICE

(75) Inventor: Michael W. Williams, Citrus Heights, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/663,042

(22) Filed: Sep. 15, 2000

(51) Int. Cl.[7] ................................. G11C 7/00
(52) U.S. Cl. .................. 365/222; 365/233; 365/189.12
(58) Field of Search ........................ 365/222, 230.02, 365/230.03, 233, 235, 236, 238.5, 239, 240

(56) References Cited

U.S. PATENT DOCUMENTS 5,253,214 A * 10/1993 Herrmann ................. 365/233
5,802,555 A * 9/1998 Shigeeda ................. 711/106
5,907,863 A * 5/1999 Bolyn ..................... 711/167
6,253,297 B1 * 6/2001 Chauvel et al. ............ 711/167

* cited by examiner

Primary Examiner—David Nelms
Assistant Examiner—Thong Le
(74) Attorney, Agent, or Firm—Michael J. Nesheiwat

(57) ABSTRACT

A memory controller to generate refresh requests for by storing the status of memory rows and an arithmetic logic unit to store a second status of all the memory rows of all the memory devices in the system memory configuration. A second logic unit stores the open status of the plurality of memory banks. The third logic generates a refresh request based on the open status and the second status in response to a refresh frequency.

19 Claims, 2 Drawing Sheets

CIRCUIT AND METHOD FOR MERGING REFRESH AND ACCESS OPERATIONS FOR A MEMORY DEVICE

BACKGROUND OF THE INVENTION

1. Field of the Invention

The present invention relates to a dynamic random access memory, and specifically to a system and circuit for refresh of a dynamic random access memory.

2. Description of the Related Art

A DRAM, or Dynamic Random Access Memory, contains a memory cell array having a plurality of individual memory cells arranged as a matrix of rows and columns. Each memory cell is coupled to one of a plurality of bit lines and to one of a plurality of word lines. This matrix is usually subdivided into a number of banks. When a DRAM delivers data from a bank, an entire row of data from the memory cells is moved from the matrix into an array of sense amplifiers, a process known as "opening a page". Subsequently, the sense amplifiers transfer a subset of the data to the DRAM device pins. Once the data has been delivered to the pins, the sense amplifiers restore the data to the memory cell and the page can be "closed".

Each memory cell in a DRAM is constructed from a single transistor and a single capacitor and is called dynamic because its data decays and become invalid due to various leakage current paths to surrounding cells and to the substrate. Therefore, to keep the data in the cells valid, each memory cell is periodically refreshed. Data in the DRAM cell array is refreshed every time it is read out of the cell array into the sense amplifiers and subsequently rewritten into the cells.

The agent that reads data out of DRAM and writes data into DRAM is known as a memory controller or DRAM controller. This memory controller is responsible for opening and closing pages, reading and writing data, and for periodically performing refresh maintenance operations on the memory cell array. Every row of the memory array needs to be refreshed before the data in the row decays to an invalid state. The typical refresh time period for one row of the DRAM array is a few microseconds. In addition, memory controllers are often designed so that they leave pages in the open state for prolonged periods of time in order to enhance memory system performance. However, since the sense amplifiers are used for the refresh operation, a fundamental conflict arises between convenient execution of refresh requests and a high-performance paging policy.

This conflict has been resolved in a few ways. One current solution is closing open pages that interfere with necessary refresh operations. Another existing solution is delaying refresh operations if there is an interference with pages that are currently open. The first policy degrades memory access operations in favor of timely refresh. The second policy also addresses the conflict, but does not fully utilize the bandwidth of the DRAM interface because of the intentional delay of the refresh operations.

BRIEF DESCRIPTION OF THE SEVERAL VIEWS OF THE DRAWINGS

The present invention is illustrated by way of example and not limitation in the following figures. Like references indicate similar elements, in which.

DETAILED DESCRIPTION OF THE INVENTION

A circuit and a method for refreshing a dynamic random access memory are described. In the following description, for purposes of explanation, numerous details are set forth in order to provide a thorough understanding of the present invention. However, it will be apparent to one skilled in the art that these specific details are not required in order to practice the present invention.

Figure 1:
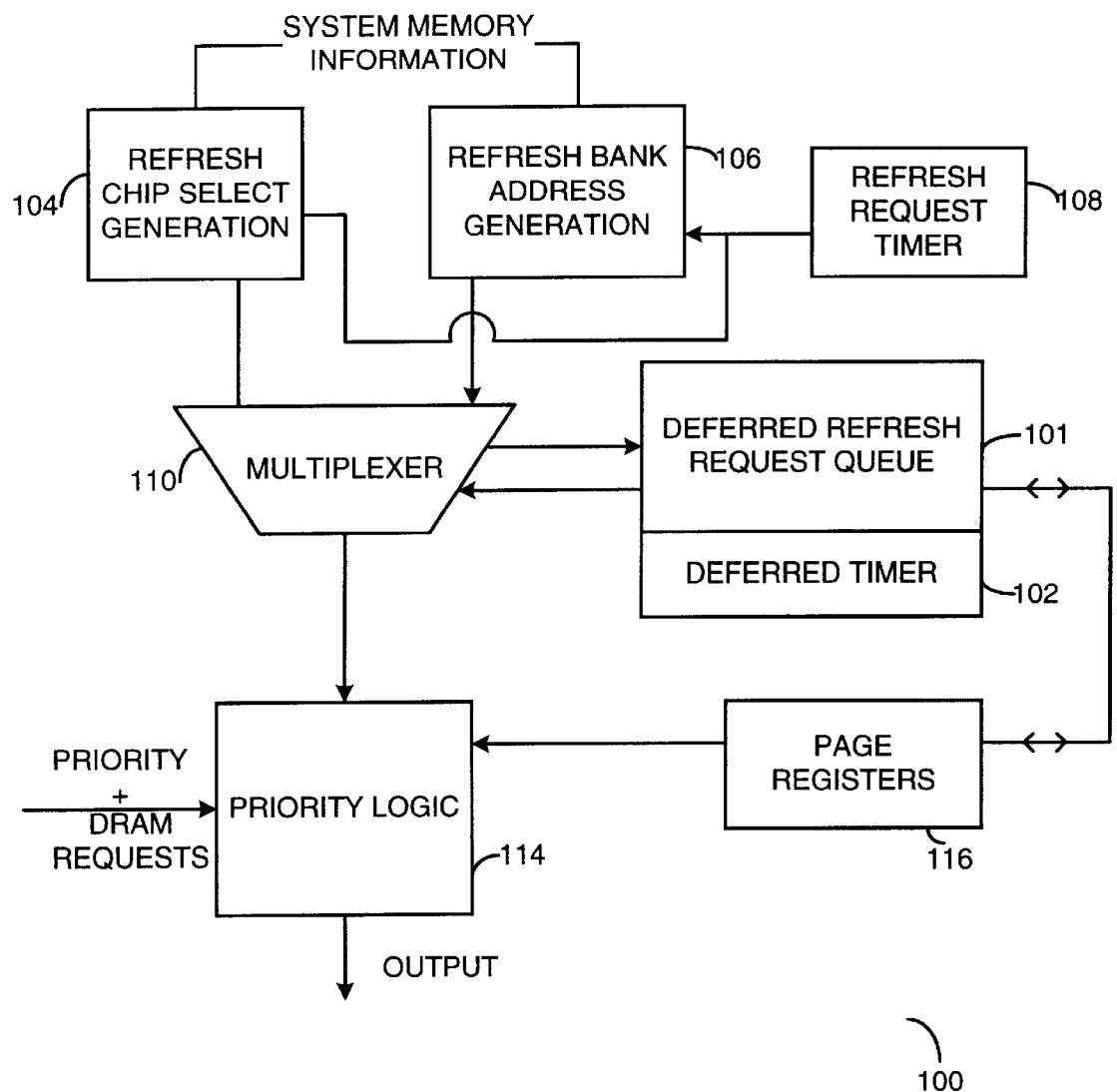
FIG. 1 illustrates a diagram of a circuit utilized by an embodiment of the present invention.

FIG. 1 illustrates a circuit 100 utilized by an embodiment of the present invention. The circuit 100 receives system memory information, specifically, the type of memory devices, the speed of memory devices, the number of memory modules populating the sockets, and the refresh specifications of the memory devices. In one embodiment, the circuit 100 receives the system memory information from a basic input and output system (BIOS). The system memory information is forwarded to a refresh chip select generation block 104, a refresh bank address generation block 106, and to a refresh request timer 108. A first and second refresh generator, the refresh chip select generation block 104 and the refresh bank address generation block 106, generate refresh requests and a multiplexer 110 selects the refresh requests in response to a deferred refresh request queue 101 and a deferred timer 102. A priority logic 114 manages the priority and handling of the refresh requests in response to a page register 116 and external requests for the memory devices. In one embodiment, the priority logic 114 forwards the refresh requests to a memory transaction scheduler. In another embodiment, the priority logic 114 forwards the refresh requests to a processor. In yet another embodiment, the priority logic 114, refresh chip select generation 104, refresh bank address generation 106, refresh request timer 108, multiplexer 110, deferred refresh request queue 101, deferred timer 102, and the page register 116 reside on a memory controller.

The system memory information determines the number and periodic rate of refresh operations needed for the system memory to insure data integrity. The refresh request timer 108 is initialized to periodically stimulate the refresh chip select generation block 104 and the refresh bank address generation block 106 to correlate with the refresh specifications of the memory devices. Thus, if a memory device requires a refresh every 20 micro-seconds, the refresh request timer 108 stimulates refresh chip select generation block 104 and the refresh bank address generation block 106 to generate refresh requests at least every 20 micro-seconds. Also, for a panic mode, a plurality of consecutive refresh requests are generated. The chip select generation block 104 generates refresh requests for a specific memory device. A memory device typically contains a plurality of memory banks. The refresh bank address generation block 106 generates refresh requests for a specific memory bank within a memory device. Thus, a refresh request comprises a pair of requests, one from the refresh bank address generation block for a memory device or memory devices and the second from refresh bank address generation block 106.

The priority logic 114 selects the refresh requests to be processed based on priority and the open memory pages stored in the page register 116. For example, the priority logic prevents a refresh request to a memory page within a memory bank having an open status if there is a pending high priority operation occurring within the memory page. Also, the memory pages with an open status, open memory pages, with a high priority operation are stored in the deferred refresh request queue 101 and a collision flag is set.

The deferred timer 102 insures the memory pages in the deferred refresh request queue 101 have a refresh request generated to meet the refresh specifications.

Upon the completion of the high priority operation on an open memory page stored in the deferred refresh request queue 101, the collision flag is reset and a refresh request is generated and processed by the priority logic. In one embodiment, a panic mode initiates a refresh request for all open memory pages in the deferred refresh request queue 101 regardless of the completion of the high priority operation.

Figure 2:
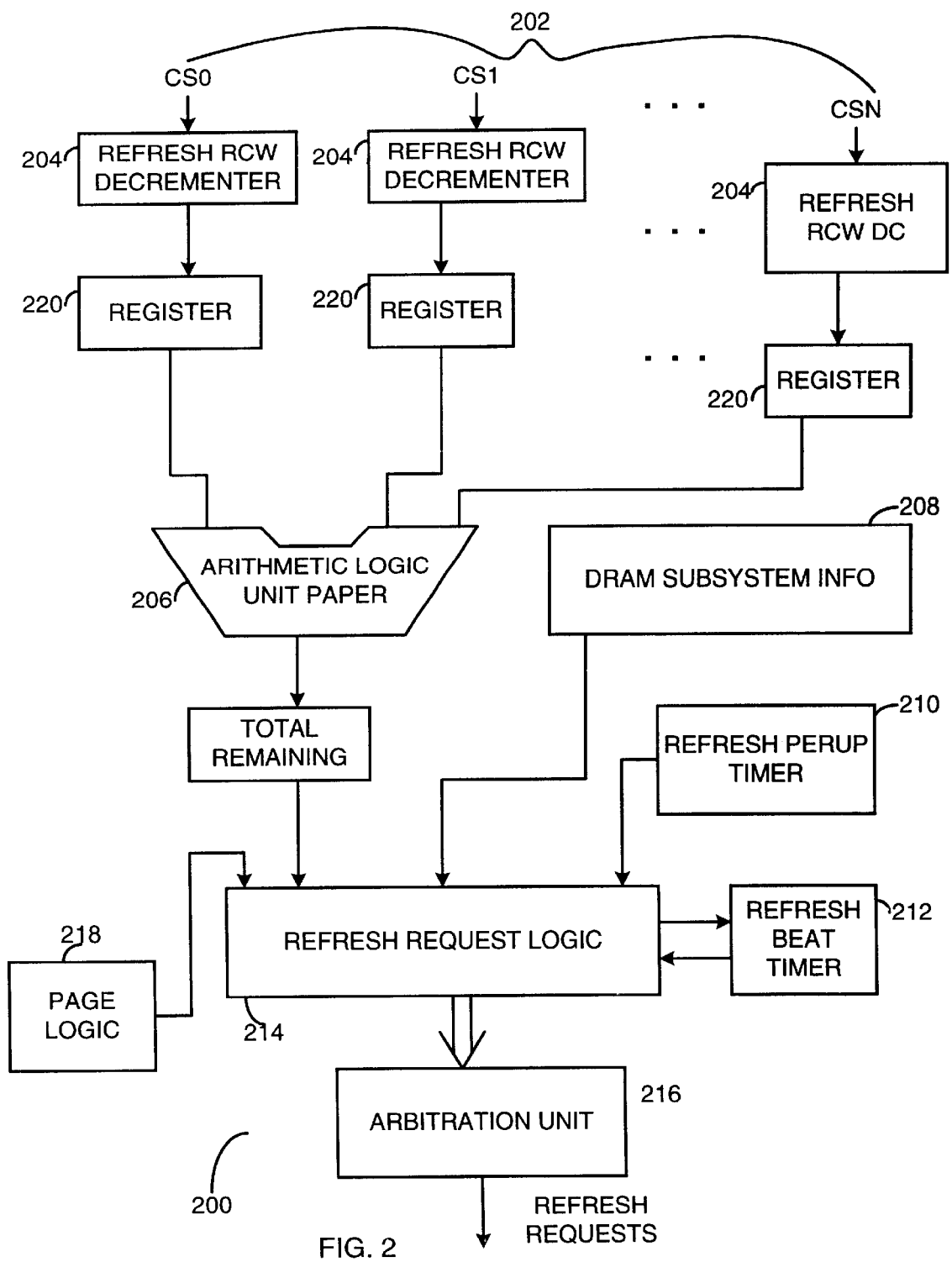
FIG. 2 illustrates a diagram of a circuit utilized by an embodiment of the present invention.

FIG. 2 illustrates a circuit 200 utilized by an embodiment of the present invention. The circuit 200 generates refresh requests. In one embodiment, the refresh requests are forwarded to a DRAM transaction scheduler. In another embodiment, the refresh requests are forwarded to a memory controller or a microprocessor. The refresh requests are generated based on the following refresh requirements: number of rows remaining to be refreshed, a global specification for refresh, system memory configuration, current status of the memory bank or memory rank The refresh beat timer 212 determines the frequency of generating the refresh requests in response to the previous requirements.

A plurality of Chip Select signals 202 are coupled to refresh row decrementers 204 which determine a first status of the number of rows remaining which require a refresh operation. Each refresh row decrementer 204 calculates the number of rows for an individual chip select signal 202 and stores them in a register 220. A second status, the total number of rows remaining is calculated by a first logic unit, the Arithmetic Logic Unit (ALU) 206. A second logic unit, the refresh request logic 214 receives memory configuration information from the DRAM Subsystem Info (208), typically from the Basic Input/Output System (BIOS). Each DRAM device has a global refresh specification and the refresh period timer 210 tracks this specification and insures refresh requests to satisfy this global refresh specification. A page logic 218 stores the status of the memory banks and memory ranks. The page logic 218 determines if the individual memory banks and memory ranks are in use.

A third logic, the refresh request logic 214 generates refresh requests in a timely and efficient manner in response to the refresh requirements. For example, if the frequency of the refresh requests fail to satisfy the global refresh specification, the refresh beat timer will "speed up" the frequency of refresh requests by instructing the refresh request logic. Therefore, the refresh beat timer 212 is the speed control for the refresh request logic.

An arbitration unit 216 receives the refresh requests from the refresh request logic 214 and receives other DRAM requests such as write and read transactions. The arbitration unit 216 determines the priority of the DRAM requests and refresh requests and forwards the requests in a priority scheme to a DRAM transaction scheduler. In another embodiment, the arbitration unit 216 forwards the requests to a memory controller.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fullest allowable scope of the claims that follow.

What is claimed is:

1. A memory controller to generate a refresh request comprising:

a plurality of registers, at least one register to store a first status of a plurality of memory rows;

a first logic coupled to the plurality of registers, to store a second status of the plurality of memory rows;

a second logic to store a open status of a plurality of memory banks; and a third logic, coupled to the first and second logic, to generate the refresh request in response to the second status and the open status at a refresh frequency.

2. The memory controller of claim 1 wherein the first status of the plurality of memory rows indicates a number of remaining rows that require a refresh operation.

3. The memory controller of claim 1 wherein the third logic receives a system memory configuration.

4. The memory controller of claim 1 wherein the third logic receives a global refresh specification.

5. The memory controller of claim 1 wherein the refresh frequency is in response to the memory configuration information and the global refresh specification.

6. The memory controller of claim 1 wherein the refresh request is forwarded to an arbitration unit to prioritize the refresh request with other memory requests.

7. A method to generate refresh requests comprising:

calculating a number of rows for one of a plurality of memory devices comprising a plurality of memory banks which require a refresh operation;

receiving a memory configuration;

receiving a global refresh specification;

storing a open status of the plurality of the memory banks; and generating the refresh request in response to a refresh frequency.

8. The method of claim 7 wherein calculating the number of rows for one of a plurality of memory devices comprises adding the number of rows with an arithmetic logic unit.

9. The method of claim 7 wherein the refresh frequency is in response to the number of rows which require a refresh operation, the global refresh specification, the memory configuration, and the open status of the plurality of memory banks.

10. An integrated circuit to generate a refresh request comprising:

a first refresh generator;

a second refresh generator;

a register to store a status of a memory page; and a logic coupled to the register and the first and second refresh generator, to generate a refresh request at a frequency.

11. The integrated circuit of claim 10 further comprising a queue to store a plurality of deferred refresh requests and a deferred refresh timer.

12. The integrated circuit of claim 10 wherein the logic further comprises an arbitration unit to receive other memory requests and determine a priority between the memory requests and the refresh requests.

13. The integrated circuit of claim 10 wherein the first and second refresh generator receive a system memory configuration.

14. The integrated circuit of claim 10 wherein the frequency is determined by a global refresh specification in response to the system memory configuration.

15. A method to generate a refresh request comprising:

generating a first refresh type;

generating a second refresh type;

receiving a refresh specification from a system memory configuration;

storing an open memory page in a register; and generating a refresh request in response to the first refresh type or second refresh type.

16. The method of claim 15 further comprising storing a deferred refresh request in a queue if the open memory page is processing a high priority transaction.

17. The method of claim 15 wherein the first refresh type is a chip select refresh generation.

18. The method of claim 15 wherein the second refresh type is a memory bank refresh generation.

19. The method of claim 16 wherein the queue comprises a timer to support a panic mode to insure the deferred refresh requests are processed before violating the refresh specification.

* * * * *